United States Patent [19]

Hama

[11] 3,922,568

[45] Nov. 25, 1975

[54] DRIVING CIRCUITS FOR ELECTRONIC WATCHES

[75] Inventor: Tetsuro Hama, Suwa, Japan

[73] Assignee: Kabushiki Kaisha Suwa Seikosha, Tokyo, Japan

[22] Filed: July 22, 1974

[21] Appl. No.: 490,591

Related U.S. Application Data

[60] Division of Ser. No. 414,572, Nov. 9, 1973, which is a continuation of Ser. No. 239,477, March 30, 1972, abandoned.

[30] Foreign Application Priority Data

Mar. 31, 1971 Japan .............................. 46-19075

[52] U.S. Cl. ............ 307/223 C; 307/205; 307/215; 307/279

[51] Int. Cl.² .................. H03K 23/22; H03K 27/00

[58] Field of Search ......... 307/205, 215, 279, 223 C

[56] References Cited

UNITED STATES PATENTS

| | | | |
|---|---|---|---|
| 3,509,379 | 4/1970 | Rapp | 307/279 |
| 3,575,617 | 4/1971 | Burns | 307/279 |
| 3,619,644 | 11/1971 | Vittoz | 307/225 C |

*Primary Examiner*—John Zazworsky
*Attorney, Agent, or Firm*—Blum, Moscovitz, Friedman & Kaplan

[57] ABSTRACT

A driving circuit for electronic watches wherein the high frequency time standard signal produced by the oscillator is divided into low frequency timing signals for providing time indication by means of ring counter circuits formed from MOS transistors. The ring counter circuit is formed from divide-by-2n counters having n stages of binary counter circuits.

3 Claims, 4 Drawing Figures

DRIVING CIRCUITS FOR ELECTRONIC WATCHES

This is a division, of application Ser. No. 414,572, filed Nov. 9, 1973, which is a continuation of Application Ser. No. 239,477, filed Mar. 30, 1972, and now abandoned.

BACKGROUND OF THE INVENTION

This invention relates to the driving circuit for electronic watches. The electronic circuit hitherto used as the divider in electronic watches, such as quartz crystal wrist watches, was a flip-flop circuit adapted to perform one-half frequency division. In such flip-flop divider circuits, a feedback frequency division was performed when dividing ratios of 1/6 and 1/12 were required, in order to carry out frequency division at desired dividing ratios, in other words, at dividing ratios of $(½)^n$. This feedback approach permitted the transformation of divide-by-16 counters into decimal by means of two diodes, due to the delay in the timing of the flip-flop circuit caused by the RC circuits incorporated therein.

SUMMARY OF THE INVENTION

Generally speaking, in accordance with the invention, a driving circuit for an electronic watch is provided including an oscillator for producing a high frequency timing signal, and dividing circuit means for dividing said high frequency timing signal into low frequency timing signals. Said divider circuit means is formed from complementary MOS transistors (metal oxide semiconductor field effect transistors). Said divider circuit means may include divide-by-2n ring counters having n stages of binary counter circuit means. Said high frequency timing signal may be applied to divide-by-4 ring counter means for reduction to an intermediate signal of a frequency below 10 Hz.

Said divider circuit means includes further divide-by-2n ring counter circuits for producing at least 1-minute, 10-minute, 1-hour and 10-hour signals, said further ring counter circuits may include divide-by-6, decimal, and divide-by-24 ring counters.

Accordingly, it is an object of this invention to provide a driving circuit for an electronic watch formed from MOS transistors which is particularly adapted for compact integration.

Still other objects and advantages of the invention will in part be obvious and will in part be apparent from the specification and drawings.

The invention accordingly comprises the features of construction, combinations of elements, and arrangement of parts which will be exemplified in the constructions hereinafter set forth, and the scope of the invention will be indicated in the claims.

BRIEF DESCRIPTION OF THE DRAWINGS

For a fuller understanding of the invention, reference is had to the following description taken in connection with the accompanying drawings, in which.

DESCRIPTION OF THE PREFERRED EMBODIMENTS

Figure 1:
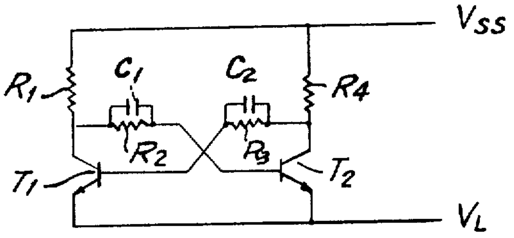
FIG. 1 is a circuit diagram of a conventional flip-flop circuit.

Referring now to FIG. 1, the conventional flip-flop circuit depicted therein consists of a pair of transistors $T_1$ and $T_2$ each having one of resistors $R_1$ and $R_4$ respectively connected in series with the emitter-collector path thereof. The base of transistor $T_1$ is connected through the parallel combination of capacitor $C_2$ and resistor $R_3$ to the collector of transistor $T_2$. In like manner, the base of transistor $T_2$ is connected through the parallel combination of capacitor $C_1$ and resistor $R_2$ to the collector of transistor $T_1$. Transistors $T_1$ and $T_2$ of are of the bipolar type and are utilized in conventional dividing arrangements which operate at a dividing ratio of $(½)^n$. The flip-flop circuit of FIG. 1 utilizes a feedback frequency division to produce the required dividing ratios of 1/6 and 1/12 required for time keeping purposes. By this feedback method, a divide-by-16 counter of the conventional type is transformed into a decimal counter by means of two diodes, taking advantage of the time delay in the flip-flop circuit due to the time delay built into the RC circuits in the flip-flop circuit of FIG. 1.

Figure 2:
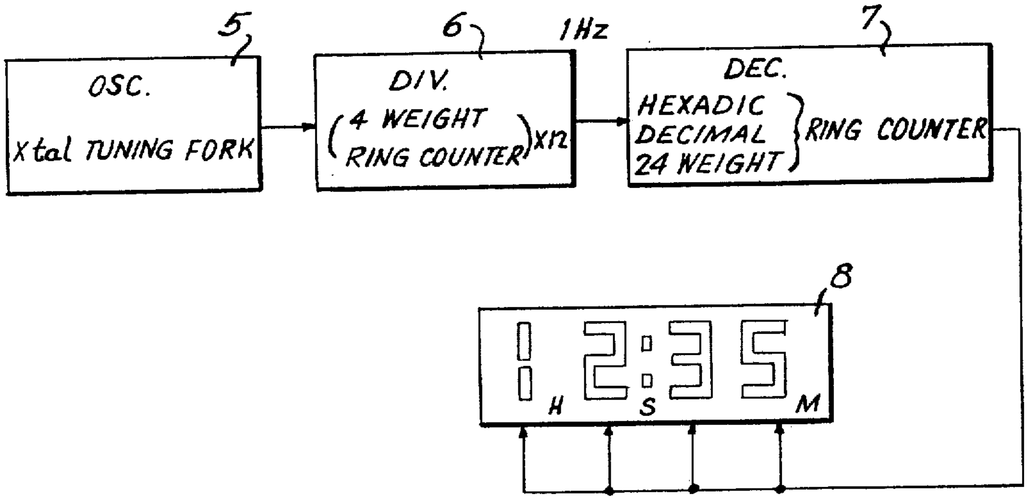
FIG. 2 is a block diagram of the driving circuits of an electronic watch in accordance with the invention.
Figure 3:
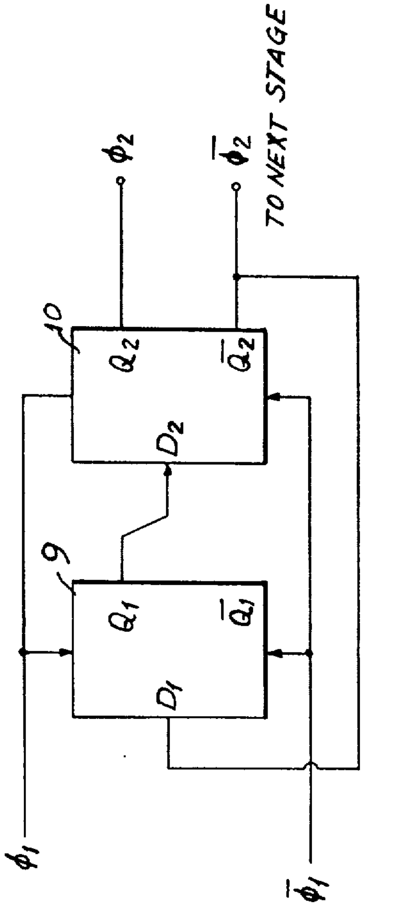
FIG. 3 is a block diagram of a ring counter for frequency division in accordance with the invention.
Figure 4:
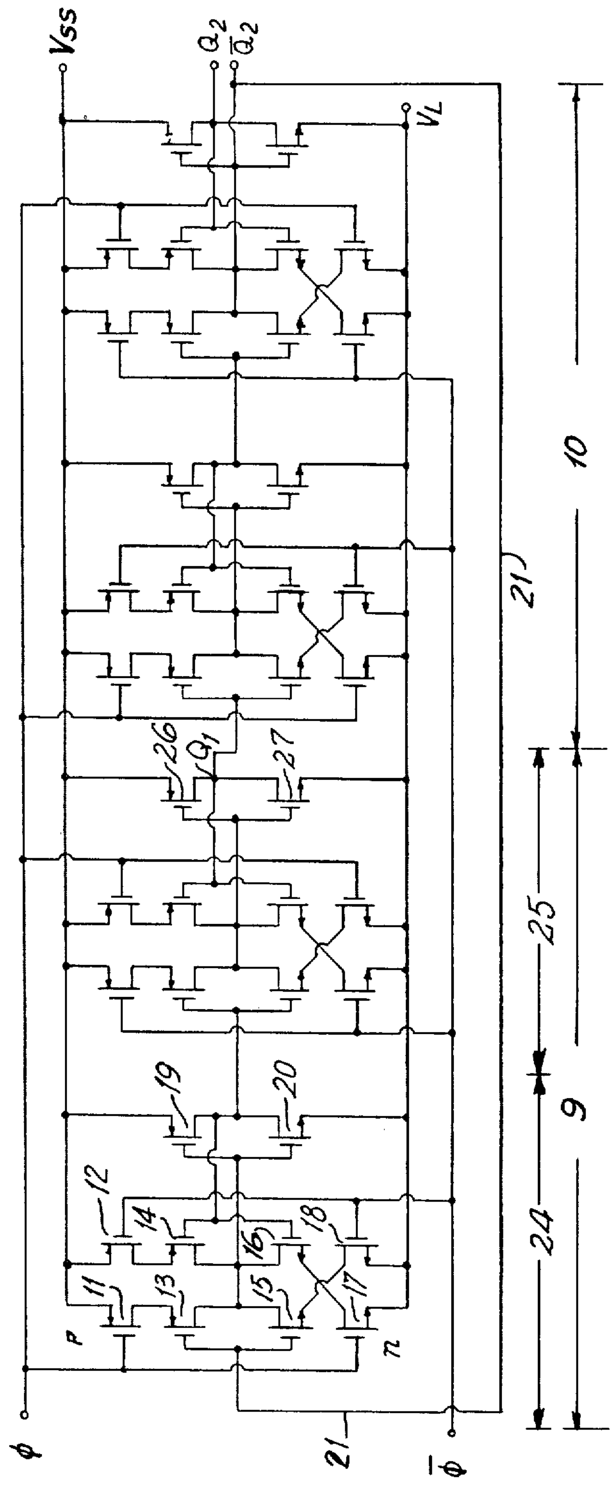
FIG.4 is a circuit diagram of the ring counters of FIG. 3.

Referring now to FIG. 2, a block diagram of the driving circuit of an electronic watch in accordance with the invention is depicted. Oscillator 5 produces a high frequency timing signal. For example, where said oscillator consists of a quartz crystal tuning fork vibrator, a time standard signal having a frequency of 16.384 kHz may be produced. Said time standard signal is applied to a divider 6 which reduces the high frequency time standard signal of oscillator 5 into an intermediate signal of one Hz. Divider 6 consists of seven ¼ frequency dividing stages connected in cascade, each of said stages consisting of ring counters. In other words, the ring counters are connected successively in a plural number of stages in order to efficiently reduce the high frequency signal to the low frequency intermediate signal. A decoder 7 produces the low frequency timing signals required to provide time indication and consists of divide-by-6, decimal and divide-by-24 ring counters. The divide-by-6 counter consists of three stages of ring counters while five stages of ring counters are required for the decimal counters. The divide-by-24 counter may be formed from two stages of divide-by-4 ring counters and three stages of divide-by-6 ring counters. A digital display device 8 is driven by the timing signals from decoder 7, and consists of a two-digit minute indication and a two-digit hour indication. In addition, the colon between the minute and hour indication may be actuated to provide an indication of seconds. Thus, in the embodiment of FIG. 2, 1-second, 1-minute, 10-minute, 1-hour and 10-hour signals may be applied from decoder 7 to display 8 for driving said display. FIGS. 3 and 4 depict, in block and circuit diagram form, respectively, a divide-by-4 ring counter formed from logic NAND and OR circuits in accordance with the invention. The divide-by-4 ring counter of FIG. 3 consists of two delay circuit stages 9 and 10 connected in cascade, the output of the second stage being fed back to the input of the first stage.

$\phi$ and $\bar{\phi}$ are clock or control signals which differ in phase by 180° from each other and are applied to control terminals. Q and $\bar{Q}$ are output signals at output terminals, the output signals of each ring counter providing the clock signals for the next ring counter by connection of the output terminals of each ring counter to the control terminals of the next ring counter. The time standard signal of oscillator 5 is in form of two signals which differ in phase by 180° which are applied as clock or control signals to the first ring counter of the divider 9.

Referring specifically to the circuit of FIG. 4, said circuit includes four identical sections each of said sections being in the nature of a complementary NOT circuit, in this embodiment, a NAND circuit. In another embodiment, each section could consist of a logic NOR circuit.

Referring to the section by way of example, said first section includes P-channel MOS transistors 11, 12, 13, 14 and 19, and N-channel MOS transistors 15, 16, 17, 18 and 20.

P-channel MOS transistors 11 and 13 are connected with their respective source-drain paths in series to define a first negative logic AND-NOT circuit. P-channel MOS transistors 12 and 14 are likewise connected with their source-drain paths in series to define a second negative logic AND-NOT circuit. The source-drain paths of N-channel MOS transistors 15 and 18 are connected in series to define a first positive logic AND-NOT circuit while the source-drain paths of N-channel MOS transistors 16 and 17 are connected in series to define a second positive logic AND-NOT circuit. Said first and second positive logic AND-NOT circuits are connected in parallel to form a positive logic AND-NOT-AND circuit as are the first and second negative logic AND-NOT circuits which define a negative logic AND-NOT-AND circuit. If the section is to be a NOR circuit, then said parallel connection would define positive and negative logic AND-OR-NOT circuits respectively.

The negative logic AND-NOT-AND circuit defined from the P-channel MOS transistors 11, 12, 13 and 14 are connected in series with the positive logic AND-NOT-AND circuit defined by the N-channel MOS transistors 15, 16, 17 and 18, said series connection being in turn connected between the terminals $V_{SS}$ and $V_L$ of the voltage source. The connection point between said positive and negative logic AND-NOT-AND circuits is connected to the gates of P-channel MOS transistor 19 and N-channel MOS transistor 20. Transistors 19 and 20 are connected with their source-drain paths in series between the terminals of the voltage source, and define an inverter, the output of which is taken at the connection point between the source-drain paths of the two transistors and defines the output of the first NAND section 24. The gates of transistors 14 and 16 are controlled by the signal at the output of the inverter defined by transistors 19 and 20. The gates of transistors 11 and 17 are controlled by the clock pulse $\phi$, while the gates of transistors 12 and 18 are controlled by clock $\phi$ which is of the reverse phase to clock $\phi$. The gates of transistors 13 and 15 define a write terminal corresponding to terminal $D_1$ of stage 9 of FIG. 3. The output of the inverter defined by transistors 19 and 20 is applied to the write terminal of the next section 25. The second section 25 consists of the same circuit as the first section 24. But, the clocks $\phi$ and $\phi$ supplied to the gate circuit of the second section are of the reverse phase to clocks supplied to the gate circuit of the first section. By this connection, the first section and the second section form a delay flip-flop circuit 9 of the first stage. Further, an output $Q_1$ of the first stage 9 is supplied to an input terminal of the second stage. The first and second stages are identical in both circuit configuration and clock signal applied thereto.

As shown in FIG. 4, the $\overline{Q}$ output of the second stage, is applied to the write terminal of the first stage along feedback line 21 to define the ring counter. Each of the two stages are controlled by the same clock pulses $\phi$ and $\bar{\phi}$. The two stage circuit of FIGS. 3 and 4 produces ¼ frequency division, a plurality of such ¼ frequency division ring counter circuits being connected in cascade to divide the high frequency timing signals of an electronic watch.

To produce a divide-by-6 ring counter circuit according to the invention, a three-stage circuit of the type depicted in FIG. 4 would be produced, the feedback wire 21 connecting the Q output of the last stage to the write terminal of the first of said three stages. In a decimal counting portion, five stages of the type depicted in FIG. 4 would be provided, the feedback going from the Q output of the last stage to the write terminal of the first stage. The divide-by-24 type counting portion would consist of two stages of the divide-by-4 ring counter circuit of FIG. 4, and three stages of the divide-by-6 ring counter described above.

The circuit according to the invention produces effective counting without the necessity of any passive elements while permitting the formation of high density integrated circuits for incorporation in electronic watches. Thus, the divide-by-2n counter in accordance with the invention offers substantial advantages over the divide-by-$2^n$ counter circuit of the prior art. One substantial advantage of the arrangement according to the invention is that, where high density integrated circuits are to be produced, external wiring is optionally required only in connection with the feedback to define the ring form. All other patterns of active elements can be advantageously set up by a common pattern to insure high density.

It will thus be seen that the objects set forth above, and those made apparent from the preceding description, are efficiently attained and, since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A section of a delay flip-flop circuit comprising first and second positive logic AND-NOT circuits each formed from the series-connection of the source-drain paths of first and second N-channel insulated gate field effect transistors; first and second negative logic AND-NOT circuits each formed from the series-connection of the source-drain paths of first and second P-channel insulated gate field effect transistors; a complementary NOT circuit formed from an N-channel and a P-channel insulated gate field effect transistor; and electric source means having a pair of terminals said first and second positive logic AND-NOT circuits being connected in parallel to define a positive logic AND-NOT-AND circuit, said first and second negative logic AND-NOT circuits being connected in parallel to define a negative logic AND-NOT-AND circuit, said positive and negative logic AND-NOT-AND circuits being connected in series with each other between said pair of terminals of said electrical source means, the series connection of said positive and negative logic AND-NOT-AND circuits defining a connecting point terminal connected to an input of said complementary NOT circuit, an output of said complementary NOT circuit defining an output of said section of said flip-flop circuit and being connected to a gate of said first transistor of each of said first positive and first negative logic AND-NOT circuits, said section of said flip-flop circuit including a write input connected to a gate of said first transistor of each of said second positive and second negative logic AND-NOT circuits; a first control signal input means connected to the gate of the second transistor of each of said first positive and second negative logic AND-NOT circuits, and a second control signal input means connected to the gate of the second transistor of each of said second positive and first negative logic AND-NOT circuits, said second control signal being the inverse of said first control signal.

2. A delay flip-flop circuit comprising a first section as defined in claim 7 and a second section comprising a further positive logic AND-NOT-AND circuit including further first and second positive logic AND-NOT circuits; a further negative logic AND-NOT-AND circuit including further first and second negative logic AND-NOT circuits; and a further complementary NOT circuit, said further positive and negative logic AND-NOT-AND circuits being connected in series with each other between said pair of terminals of said electrical source means, the series connection of said further positive and negative logic AND-NOT-AND circuits defining a connecting point terminal connected to an input of said complementary NOT circuit, an output of said complementary NOT circuit defining an output of said delay flip-flop circuit and being connected to a gate of said first transistor of each of said further first positive and first negative logic AND-NOT circuits, said second section of said flip-flop circuit including a write input connected to a gate of said first transistor of each of said further second positive and second negative logic AND-NOT circuits, said write input of said second section being connected to the output of said first section, said first control signal input means being connected to the gate of the second transistor of each of said further second positive and further first negative logic AND-NOT circuits, said second control signal input means being connected to the gate of the second transistor of each of said further first positive and further second negative logic AND-NOT circuits, the output of said second section of said flip-flop circuit defining the output of said flip-slop circuit.

3. A ring counter comprising first and second delay flip-flop circuits as defined in claim 2, the output of sasid first delay flip-flop circuit being connected to the input of said second delay flip-flop circuit, the connecting point terminal connected to the input of the further complementary NOT circuit of the second delay flip-flop circuit being connected to the input of the first delay flip-flop circuit.

* * * * *